(12) United States Patent
Wu

(10) Patent No.: US 6,481,091 B2
(45) Date of Patent: Nov. 19, 2002

(54) METHOD OF PREPARING BISMUTH OXIDE SUPERCONDUCTING WIRE

(76) Inventor: Hengning Wu, 11627 N. Shore Dr., Reston, VA (US) 20190

( * ) Notice: Subject to any disclaimer, the term of this patent is extended or adjusted under 35 U.S.C. 154(b) by 32 days.

(21) Appl. No.: 09/681,723

(22) Filed: May 25, 2001

(65) Prior Publication Data

US 2002/0029458 A1 Mar. 14, 2002

Related U.S. Application Data

(62) Division of application No. 09/659,218, filed on Sep. 11, 2000.
(51) Int. Cl.$^7$ ............................................... H01L 39/24
(52) U.S. Cl. ........................ 29/599; 505/230; 505/231; 505/430; 505/431; 505/740; 505/782
(58) Field of Search ........................... 29/599; 505/230, 505/231, 430, 431, 740, 782, 784, 813, 821

(56) References Cited

FOREIGN PATENT DOCUMENTS

| JP | 01-119514 | * | 5/1989 |
| JP | 03-194803 | * | 8/1991 |

OTHER PUBLICATIONS

Reactions between YBaCu superconducting Oxide and metallic Copper and preventions of them; Sata, T et al; J Ceramic Soc of Japan, Vol 100, No 1, pp. 66–69.*

Transport Critical Current Densities and Magnetization in Superconducting Silver Sheatheed–Ag Sn/YBCO Composite Wires, j. Chikaba; IEEE Trans on Magnetics vol. 28, No. 1, pp. 896–899, Jan., 1992.*

Development of Technical High T Superconductor Wires and tapes, J. Tenbrink et al, IEEE Trans on Applied Superconductivity, Vol 3, No. 1, Mar. 1993, pp. 1123–1126.*

R & D of Ag–Sheathed Bi–2223 Superconducting Tapes, Y. Kamisada et al, IEEE Trans on Magnetics, ol. 30, No.4, Jul. 1994, pp. 1675–1680.*

* cited by examiner

*Primary Examiner*—Carl J. Arbes

(57) ABSTRACT

The present invention provides a method to prepare a (Bi,Pb)SrCaCuO-2223 superconducting wire with improved critical current density at reduced cost. In general, the basic method according to the present invention comprises the steps of: (a) preparing a starting precursor powder with the oxygen content adjusted to the value of the final 2223 phase; (b) filling the starting powder into a metal sheath; (c) performing deformation processing on the metal sheath to form a composite wire and develop texture in the 2212 superconducting phases; (d) sealing said metal sheath so that a fixed oxygen content is maintained; (e) performing sintering to obtain the (Bi,Pb)SrCaCuO-2223 phase. The method uses metals other than a silver-based material in the sheath material, thus significantly reducing the materials cost of the (Bi,Pb)SrCaCuO-2223 superconducting wire.

8 Claims, No Drawings

METHOD OF PREPARING BISMUTH OXIDE SUPERCONDUCTING WIRE

CROSS REFERENCE TO RELATED APPLICATIONS

This application is a division of application Ser. No. 09/659218, filed Sep. 11, 2000, now U.S. Patent, granted 2001.

BACKGROUND OF INVENTION

The present invention relates to a method of preparing a (Bi,Pb)SrCaCuO-2223 superconducting wire.

The superconductor with a nominal composition of $(Bi, Pb)_2Sr_2Ca_2Cu_3O_x$, the 2223 phase with a superconducting transition temperature of 110 K, has a variety of industrial applications. Besides its uses in the monolithic forms, it has been made into superconducting composite wires with promising performance for an even more wide range of engineering applications. A successful method of preparing a superconducting wire is the so-called oxide powder-in-tube (OPIT) process (S. Jin et al., U.S. Pat. No. 4,952,554, 1990). The OPIT process includes the three stages of: preparing a powder of superconductor precursor oxides (precursor powder preparation stage); filling the precursor powder into a metal tube and reducing the cross section of the tube through mechanical deformation such as swaging, rolling or drawing, and for multifilamentary articles, assembling the previously formed bundles and further deforming the assembly into a multifilamentary wire or tape (mechanical deformation stage); and subjecting the composite to a sintering process, and if necessary, repeated deformation (pressing or rolling) and sintering processes, to obtain the desired superconducting properties (thermomechanical processing stage). The precursor powder preparation stage provides the starting precursor powder with appropriate composition, phase assembly, and particle size. The mechanical deformation stage provides the required geometry of the composite and more importantly the texture formation of the precursor powder. The thermomechanical processing stage is responsible for the final phase transformation into the superconducting 2223 phase and related superconducting properties.

Since the 2223 phase is thermodynamically metastable and will decompose at the sintering temperature, direct use of the 2223 phase as the starting powder for the OPIT process will result in poor superconducting properties. Therefore, a powder of precursor oxides corresponding to the cation composition of the final 2223 phase is used as the starting powder. The 2223 phase has a wide solid solution range and the actual composition is slightly different from the nominal composition of $(Bi,Pb)_2Sr_2Ca_2Cu_3O_x$. For example, a commonly used composition is $Bi_{1.72}Pb_{0.34}Sr_{1.83}Ca_{1.97}Cu_{3.13}O_x$. The precursor powder, upon one or more subsequent chemical reactions, is then converted into the 2223 superconducting material in combination with greater or lesser amounts of secondary phases. Because the desired 2223 superconducting material is formed by a series of chemical reactions, the superconducting properties will depend on the chemical and phase composition of the starting materials and on the subsequent processing conditions, such as temperature, time, and oxygen partial pressure.

A common phase composition of the precursor powder consists of a tetragonal or orthorhombic 2212 phase, and one or more nonsuperconducting phases necessary for the final conversion into the 2223 phase. The tetragonal 2212 phase has equivalent a and b axes with a lattice parameter of about 5.4 angstroms. The conversion of the tetragonal to the orthorhombic phase corresponds to the formation of an oxygen deficient structure with unequal a and b axes, as described in R. Flukiger et al., Phase formation and critical current density in Bi,Pb(2223) tapes, Supercond. Sci. Technol. 10 (1997) pages A68–A92. The conversion occurs simultaneously with the incorporation of a dopant having a variable oxidation state, i.e., Pb or Sb, into the structure. The secondary phases may be considered desirable secondary phases such as, $(Ca,Sr)_2CuO_3$, $CuO$, $(Ca_{2-x}Sr_x)PbO_4$ and $(Ca_{2-x-y}Sr_xCu_y)(Pb_{1-n}Bi_n)O_z$ (3221 phase), which promote the formation of the 2223 phase and decrease the size of impurity phases, depending on the sintering conditions. Undesirable second phases may include 2201, 3221, $CaCuO_2$, and un-reacted metal oxides depending on the particular sintering conditions.

When tetragonal 2212 is used in the precursor powder, a transient liquid phase is first formed and tetragonal 2212 is converted into Pb-doped orthorhombic 2212 during the sintering process. The Pb-doped 2212 phase then reacts with other oxide phases to form the 2223 phase. The transient liquid will promote densification and grain growth. However, oxygen must be released during the conversion from tetragonal 2212 to orthorhombic 2212 phase. The oxygen release may be limited by the diffusion of oxygen through the silver sheath and newly formed phases, and inhomogeneous phase formation may occur due to the difference in local oxygen partial pressure, and bubbles may form in the composite wire due to the released oxygen. Repeated pressing/rolling and sintering are often necessary to achieve a high critical current density. A prior art method releases the oxygen before the sintering process by adding a tetragonal to orthorhombic conversion process in the mechanical deformation stage (Q. Li, et al., U.S. Pat. No. 6,069,116, 2000). Although this approach is successful in achieving a high critical current density, the diffusion of oxygen through the silver sheath is a time consuming process. Moreover, the choice of sheath materials is limited to silverbased materials as silver is the only metal permeable to oxygen.

When the 2212 phase in the precursor powder is a fully Pb-doped orthorhombic phase, all the Pb in the final composition is essentially in the 2212 phase. Faster reaction kinetics and more complete transformation into the 2223 phase were observed for such a precursor powder, as discussed in S. E. Dorris, et al., Methods of introducing lead into bismuth-2223 and their effects on phase development and superconducting properties, Physica C 223 (1994) pages 163–172. Furthermore, the orthorhombic 2212 phase seems to develop better deformation texture during the mechanical deformation process. However, the connectivity may be not as good compared with the powder with the tetragonal 2212 phase and the critical current density may be adversely affected accordingly.

It is recognized the transformation from tetragonal to orthorhombic 2212 is a continuous process depending on the temperature, oxygen partial pressure, and time of the calcination process. The Pb content and the lattice parameters of the 2212 phase are between the two extreme cases. A well-controlled calcination process should produce the desired 2212 phase with a narrow Pb content range. However, variations in the processing condition can produce a powder with Pb content of the 2212 phase spreading the whole composition range. The temperature and oxygen partial pressure range of each phase can be obtained from published phase diagrams. The powder phase composition moves from tetragonal 2212 to orthorhombic 2212 with increasing Pb content as the temperature or oxygen partial pressure shifts from the tetragonal range to the orthorhombic range. It seems that the best results in critical current density have been obtained from precursor powders with the tetragonal 2212 phase and better reproducibility is obtained from precursor powders with fully doped orthorhombic 2212 phase.

It is also suggested that presence of certain amount of the 2223 phase in the precursor powder may act as seeds to promote the 2223 formation kinetics and improve the critical current density (K. Sato et al., U.S. Pat. No. 5,610,123, 1997). However, the values of critical current density obtained by this method are not as high as the best results from the precursor powders with the tetragonal 2212 phase.

The precursor powder preparation methods can also be divided into two categories according to the calcinations method: so-called one-powder process and two-powder process (see, for example, J. Jiang and J. S. Abell, Effects of precursor powder calcination on critical current density and microstructure of Bi-2223/Ag tapes, Supercond. Sci. Technol. 10 (1997) pages 678–685). In a one-powder process, all the materials are mixed and calcined together. In a two-powder process, the preparation of the Pb-doped 2212 phase is separated from the preparation of the remaining oxide phases, then the two powders are mixed to form the precursor powder (S. E. Dorris et al., U.S. Pat. No. 5,468,566, 1995, and S. E. Dorris, et al., U.S. Pat. No. 5,354,535, 1994). The two-powder process may offer better quality control since the phases and particle sizes of the two powders can be controlled independently.

As for the sheath material, a silver-based material is the material of choice. Noble metals are the only metallic materials that do not have adverse reactions with the superconducting precursor powder. Among the noble metals silver is the only material permeable to oxygen. Silver-based materials include silver, silver alloys with other noble metals, and silver enhanced with dispersed oxides such as MgO. Direct use of other metals as the sheath material is not feasible due to chemical reaction and oxygen diffusion. For short samples of a few centimeters in length, oxygen can pass through the ends of the wire, but this is not practical for industrial wires of hundreds of meters in length. A proposed prior art method to reduce the material cost is to use an inexpensive metal to replace silver at the outer surface and there are holes in the metal packed with silver so that oxygen diffusion can take place at these openings (S. Hagino, et al., U.S. Pat. No. 4,983,576, 1991, and S. Hagino, et al., U.S. Pat. No. 5,068,219, 1991). However, such a construction makes the mechanical deformation and the thermomechanical processing very difficult.

It is also well known that there is a dense, well-textured layer of about 2–3 $\mu$m in the 2223 phase at the silver interface, which has a very high critical current density. At the center of a superconducting filament, the microstructure may be porous, the texture may be not as good, and the critical current density may be lower. A very high critical current density value is obtained in a prior art wire-in-tube method where a thin layer of superconductor is formed between the gap of the inside silver wire and the outside silver tube (U. Balachandran et al., U.S. Pat. No. 5,874,384, 1999). However, the engineering critical current density is not high due to the low packing ratio of the superconductor. Progress has been made in improving the engineering critical current density by increasing the superconductor-silver interface, but this is limited by the formation of interlinks between the superconducting filaments when the filaments and the silver layers between them become thinner and thinner. A method to improve the texture formation inside the filament is a more desirable solution.

SUMMARY OF INVENTION

Accordingly, an object of the present invention is to provide a method of reducing the materials cost of the sheath in the superconducting composite.

Another object of the present invention is to provide a method of preparing a precursor powder with a specified phase composition and oxygen content.

The present invention provides a means of preparing the precursor powder to a specified phase composition and oxygen content for the preparation of a (Bi,Pb) SrCaCuO-2223 superconducting wire at low cost. In general, the basic method according to the present invention comprises the steps of: (a) preparing a starting precursor powder with the oxygen content adjusted to the value of the final 2223 phase; (b) filling the starting powder into a metal sheath; (c) performing deformation processing on the metal sheath to form a composite wire and develop texture in the 2212 superconducting phases; (d) sealing said metal sheath so that a fixed oxygen content is maintained; (e) performing sintering to obtain the (Bi,Pb) SrCaCuO-2223 phase, in which the sintering is performed in an approximately constant volume condition.

In order to obtain high critical current density, the starting precursor powder is obtained by: (a) preparing a first powder containing a fully doped 2212 phase having a Pb content close to the final amount, and non-superconducting phases mixed therewith; (b) preparing a second powder containing an under-doped 2212 phase having a Pb content less than half the final amount, and non-superconducting phases mixed therewith; (c) mixing the first powder and the second powder in a proper proportion to form a starting precursor powder. Additional nonsuperconducting oxide phases may be added to obtain the final cation composition and oxygen content.

The solubility of Pb in 2212 depends on the composition, temperature and oxygen partial pressure. Phase diagrams for the temperature and oxygen partial pressure dependence of the solubility are available in the literature for some compositions. See, for example, P. Majewski, Phase diagrams studies in the system Bi—Pb—Sr—Ca—Cu—O—Ag, Supercond. Sci. Technol. 10 (1997) pages 453–467. It can also be determined experimentally for a particular composition. Generally speaking, the solubility is larger for lower oxygen partial pressures. Given an oxygen partial pressure, such as air at ambient pressure, the solubility increases with temperature until a maximum value is reached. By choosing the proper composition, temperature, and oxygen partial pressure, the 2212 phase with the desired Pb content can be prepared.

It is known that during the sintering process, the first reaction is a transformation of the un-doped tetragonal or under-doped orthorhombic 2212 phase into the Pb-doped 2212 orthorhombic phase, and then the (Bi,Pb)2212 phase reacts with other phases to form the desired 2223 phase, as summarized in R. Flukiger et al., Phase formation and critical current density in Bi,Pb(2223) tapes, Supercond. Sci. Technol. 10 (1997) pages A68–A92. The liquid-assisted reaction to form the (Bi,Pb)2212 phase causes significant grain growth. Because of the heavy mechanical deformation, the particle size of 2212 before sintering can be extremely small, even amorphous for some powders. The newly formed grains do not necessarily follow the texture of its precursor. On the interface of silver, there is an interface-induced texture formation. In the center part, grains can grow in other directions, usually causing swelling of the wire. Therefore, the present invention uses two 2212 phases to take advantage of the better deformation characteristic of a fully doped orthorhombic (Bi,Pb)2212 phase and the liquid formation associated with a tetragonal 2212 phase or under-doped orthorhombic 2212 phase. The fully doped orthorhombic (Bi,Pb)2212 phase will develop better texture during the mechanical deformation process. During the initial sintering process, the fully doped (Bi,Pb)2212 phase does not have any phase transformation, thus keeping its original texture. Its grain size may increase. The tetragonal or under-doped orthorhombic 2212 phase will undergo the liquid-assisted reaction to form the (Bi,Pb)2212 phase. With the presence of the pre-existing textured (Bi,Pb)2212 phase, the growth of the newly formed (Bi,Pb)2212 grains in directions different from these allowed by the texture is limited to the distance between the plates of the original (Bi,Pb)2212 phase. These smaller grains are more likely to be consumed in the sintering process. Therefore, the pre-existing (Bi,Pb)2212 phase effectively acts as a template for texture formation. This eventually will result in better texture formation, densification, and connectivity of the 2223 phase. According to the present invention, due to this extra texture mechanism, relatively thick superconducting filaments can be used while maintaining the level of texture formation and thus a high critical current density in the superconducting wire. As the grains are better aligned, a denser microstructure will be obtained.

In prior art methods, the 2212 phase has one composition with a certain scattering due to variations in processing conditions such as temperature, oxygen partial pressure, and chemical composition. Therefore, it is not possible to combine the advantages of both 2212 phases. When tetragonal 2212 is used, the texture may be not good. When the fully doped (Bi,Pb)2212 phase is used, Pb is not present in the remaining phases and not enough liquid is formed. In between, the 2212 composition is not the optimum composition as discussed above. A systematic study of the effect of the Pb content in 2212 in a prior art method can be found in S. E. Dorris, et al., Methods of introducing lead into bismuth-2223 and their effects on phase development and superconducting properties, Physica C 223 (1994) pages 163–172.

It should be emphasized that the composition of the phase is more important than the structure. For example, when the calcination condition is in the range with a low solubility limit of Pb in the 2212 phase, a mixture of the tetragonal 2212 and the under-doped orthorhombic 2212 phase may be produced, but the under-doped orthorhombic 2212 phase cannot act as a template. On the other hand, a powder can have all the 2212 phases in the orthorhombic structure and good texture will be developed according to the present invention when one 2212 phase is fully doped and the other is under-doped.

It should be pointed out that in some prior art methods the Pb content of the 2212 phase may spread through the whole composition range due to extreme variations in processing conditions. For example, vacuum degassing of a powder with the tetragonal 2212 phase for a very short time may convert a part of the powder into the orthorhombic 2212 phase. Chemical segregation in a powder before calcination may also cause extreme composition variations. However, it is difficult to control the composition and amount of different 2212 phases in those situations. This may account for the poor reproducibility of some very good results of critical current density obtained from powders with the tetragonal 2212 phase.

The present invention provides an efficient and consistent method to obtain the proposed phase assembly.

According to the present invention, the Pb content of the fully doped (Bi,Pb) 2212 phase should be preferably within 15% of the final composition, and more preferably within 10% of the final composition, and most preferably within 5% of the final composition. The Pb content of the under-doped 2212 phase should be less than 50%, preferably less than 20%, and more preferably less than 10% of the final composition.

According to the present invention, the amount of the fully doped (Bi,Pb)2212 phase should be preferably around 10% to 60% of the total volume of the starting powder. The weight percentage can be calculated from the density of all the phases. The optimum volume percentage will also be related to other processing factors. For most powders, a more preferred volume percentage is from 20% to 30%

According to the present invention, the particle size of the precursor powder is preferably less than 5 $\mu$m, and more preferably less than 2 $\mu$m. Especially, the particle size of nonsuperconducting phases should be much smaller, preferably less than 1 $\mu$m and more preferably less than 0.5 $\mu$m. To fully control the particle size, the 2212 phases can be prepared separately from the remaining oxide phases. Therefore, different techniques can be applied to each phase or mixture of phases. These techniques include freeze drying, spray pyrolysis, co-precipitation, co-decomposition, and mechanical grinding.

It is known that oxygen release is a problem when the tetragonal 2212 phase is used in the precursor powder and Pb mainly exists in the $Ca_2PbO_4$ structure. A prior art approach adds an oxygen release treatment of the wire before the rolling and sintering process (Q. Li, et al., U.S. Pat. No. 6,069,116, 2000). Since oxygen diffusion through silver sheath is involved, this is a time-consuming process. An alternative approach used in the present invention is to address the oxygen problem at the precursor preparation stage. In the present invention, part of the Pb exists in the 2212 phases, the oxygen release problem is alleviated. To further reduce the oxygen content, the 2212 phases and other oxide phases can be quenched from the calcination temperature to retain the low oxygen content. PbO ($Pb^{+2}$) can be used to partially replace CaPbO ($Pb^{+4}$).

In one aspect of the present invention, the oxygen content of the precursor powder is adjusted to around the value of the final 2223 phase so that metals other than silver can be used as the sheath material to reduce the materials cost of the superconducting wire. Accordingly, the sintering condition will be changed from the normal constant oxygen partial pressure environment to a fixed oxygen content environment. Such replacements are also beneficial for special purposes such as high strength and low thermal conductivity. Since the precursor powder reacts with most metallic materials at the sintering temperature, the first step is to use a silver-based material as the sheath material for each individual filament but replace the silver-based material with another metal as the outside sheath material in a multifilamentary wire. A metal with little solubility with silver is preferred, such as nickel. When a metal (such as copper) with a large solubility with silver is used, a diffusion barrier layer will be applied. Apparently, the replacement metal should have a melting temperature higher than 850° C. and enough plasticity to withstand the mechanical deformation process. A suitable metal can be chosen from a group consisting of carbon steels, stainless steels, superalloys, nickel and nickel alloys, copper and copper alloys, titanium and titanium alloys.

To replace silver in the inner sheath, a strong and coherent buffer layer should be developed between the superconductor and the metal sheath. The buffer layer can be chosen from a group consisting of silver, silver alloy, and oxides that do not react with the precursor powder such as MgO and $BaZrO_3$.

By "wire", as the term is used herein, it is meant an elongated article with its length dimension significantly larger than the dimensions of the cross section. It is equivalent to a tape, a ribbon, a rod, or the like, used in the literature.

By "fully doped 2212", as the term is used herein, it is meant a 2212 phase with a Pb content close to the final composition of the 2223 phase. Put it another way, nearly all the Pb intended to be incorporated into the 2223 phase is in the 2212 phase. By "under-doped 2212", as the term is used herein, it is meant a 2212 phase with a Pb content less than 50% of the value in the final composition of the 2223 phase.

The dopant Pb can be partially or completely replaced by Sb. For simplicity, Pb dopant is used in the discussion and examples. Pb is also the preferred dopant.

DETAILED DESCRIPTION

In order to carry out the method of preparing a (Bi,Pb)SrCaCuO-2223 superconducting wire according to the present invention, first prepared is a starting precursor powder with its oxygen content adjusted to the value of the final 2223 phase.

The oxygen content of the final 2223 phase can be determined experimentally by chemical analysis. The 2223 phase can be formed by sintering at a temperature and the corresponding oxygen partial pressure normally used in constant pressure sintering condition. Then the 2223 phase is quenched from the sintering condition and the oxygen content is measured. As the 2223 phase can be formed in a range of temperatures and oxygen partial pressures, the oxygen content also has its range of values. The value chosen will affect the sintering conditions.

An advantage of the 2223 phase over other high temperature superconductors is that its superconducting transition temperature is not very sensitive to the oxygen content. For example, a $YBa_2Cu_3O_x$ sample quenched from the sintering temperature will have a low oxygen content and it is not superconducting. An oxygen annealing is necessary to obtain superconductivity in the quenched $YBa_2Cu_3O_x$ sample. However, a quenched 2223 phase from a normal sintering condition has nearly the same superconducting transition temperature as the value for a slowly cooled sample.

A first powder which contains a 2212 phase with a Pb content close to the value of the final (Bi,Pb)SrCaCuO-2223 composition is prepared. Depending on the composition and processing conditions, certain non-superconducting phases may also be present in the powder. The calcination temperature and oxygen partial pressure are chosen so that the desired 2212 composition is within the solubility limit of Pb.

A second powder is prepared which contains a 2212 phase with a Pb content less than 10% of the value of the final (Bi,Pb)SrCaCuO-2223 composition. The remaining Pb content is in the nonsuperconducting phases. The amount of Pb in the 2212 phase and the amount of PbO phase can be used to adjust the oxygen content.

Both powders are quenched from the calcination temperature to maintain a low oxygen content. Then, appropriate amount of the first powder is mixed with the second powder to give the volume fraction of 20% to 30% to the fully doped 2212 phase. Additional nonsuperconducting oxide phases may be added to obtain the final cation composition and oxygen content. The powder is pulverized, into a particle size less than 5 $\mu$m, preferably less than 2 $\mu$m, with a ball mill, a micromill, an attriter, or the like, preferably in a glove-box filled with dry nitrogen or argon to avoid pick-up of moisture.

To prepare a superconducting composite wire, the precursor powder is then filled into a metal sheath. The metal sheath thus filled with the precursor powder is subjected to deformation processing such as swaging, drawing, extrusion, and rolling. The deformation process reduces the size of the composite to form a single filament wire. For a multifilamentary wire, the composite wire of single filament is cut into many sections and bundled together into another metal sheath, and the deformation process is repeated. To develop texture in the precursor 2212 phase, a rolling deformation with a total deformation ratio of about 70% is applied to produce a tape-like composite wire.

To use metals other than a silver-based material in the outer sheath and silver in the inner sheath, a suitable material such as nickel alloy can be used. The sintering atmosphere will be the atmosphere suitable for the sheath material. The sheath must be effectively sealed so that no oxygen loss of the superconducting oxide will occur.

A diffusion barrier can be used between the outer sheath material and inner sheath of silver to avoid possible harmful reactions. Diffusion barriers have been widely used in the preparation of $Nb_3$ Sn superconducting wires and in semiconductor industry. For example, metals with very low solubility of the sheath materials can be used to reduce interdiffusion of sheath materials, and oxides with low diffusivity of oxygen can be used to reduce oxygen diffusion. Such data are readily available in reference books on phase diagrams and diffusivity.

To further reduce the amount of silver, a non-silver metal is used in the sheath in the preparation stage of the single filament wire. A buffer layer is used between the sheath material and the superconducting oxide. The design of the composite can also take into considerations of requirements for a.c. loss.

Then the composite wire is heat treated to form the (Bi,Pb)SrCaCuO-2223 phase. The sintering atmosphere is chosen according to the outer sheath material and extra pressure may be applied in case of bubbling in the tape. The optimum sintering temperature is related to the cation composition and oxygen content chosen. To the best knowledge of the applicant, most phase diagram studies are conducted under constant pressure condition, normally in air or in 8–10% oxygen at ambient pressure. This is no surprise since the prior art sintering is performed under a constant pressure condition. The sintering condition for the fixed oxygen content in the present case is best represented by a constant volume condition neglecting the small change caused by thermal expansion. The phase relation under this condition can be either calculated from the constant pressure data plus some thermodynamic parameters by commercial phase diagram software such as Calphad, or determined experimentally. Generally speaking, a sintering temperature around the value for the measurement of the oxygen content of the 2223 phase can be used. Slight oxidation at the interface of the sheath material may occur but the sintering condition is very different from the constant pressure conditions used in the prior art where oxygen exchange can occur between the 2223 phase and the sintering atmosphere. If a second or third heat treatment should be applied, a deformation of about 10% is applied to increase the density and texture before the heat treatment.

The present invention will be further illustrated by the following examples.

EXAMPLE 1

This example will show how to balance the oxygen content of the precursor powder. The oxygen content range of the final 2223 phase can be determined experimentally by chemical analysis. The major source of oxygen release is caused by the valence change of $Pb^{+4}$ in $(Sr,Ca)_2PbO_4$ to $Pb^{+2}$ in the superconducting phases. Therefore, partial or complete replacing of $(Sr,Ca)_2PbO_4$ by PbO can be used to decrease the oxygen content of the precursor powder.

$Bi_2O_3$, PbO, $SrCO_3$, $CaCO_3$ and CuO are mixed to get the cation ratio of Bi, Pb, Sr, Ca and Cu of 1.75:0.35:1.90:2.05:3.05. The mixture is thoroughly ground to a particle size of less than 5 $\mu$m. The mixture is pressed into pellets and calcined twice with intermediate grinding at 750° C. and 800° C. respectively for 8–12 hours in $CO_2$-free flowing air. Then the material is ground again and calcined at 800° C. in 1% oxygen (balance nitrogen or argon) for about 8 hours and then quenched to room temperature to obtain the first powder.

$Bi_2O_3$, PbO, $SrCO_3$, $CaCO_3$ and CuO are mixed to get the cation ratio of Bi, Pb, Sr, Ca and Cu of 1.75:0.04:1.90:2.05:3.05. The mixture is calcined in the same way as above. The amount of Pb in this powder can be adjusted to change the oxygen content of the final precursor powder. PbO is then added to make the second powder with a composition ratio of Bi, Pb, Sr, Ca and Cu of 1.75:0.35:1.90:2.05:3.05.

Then the first powder is mixed with the second powder in a weight ratio of about 3:7. The mixture is pulverized to obtain a precursor powder with a particle size less than 5 $\mu$m and preferably less than 2 $\mu$m.

EXAMPLE 2

This example will show the use of metals other than silver as part of the sheath material. Now the sintering condition is changed from the normal constant oxygen partial pressure environment to a fixed oxygen content environment. Therefore, it is necessary to start with the right oxygen content.

The precursor powder prepared in Example 1 will be used. The precursor powder is filled into a silver or silver alloy tube of 25 mm outer diameter and 22 mm in inner diameter, which in turn is swaged into 12 mm in diameter, drawn into 4.0 mm in diameter. The single filament wire is cut into 19 sections of equal length. The single filament sections are packed into a nickel or nickel alloy tube of 25 mm in outer diameter and 22 mm in inner diameter, and the tube is then pumped to vacuum and sealed by welding. The composite is swaged into 12 mm in diameter, drawn into 1 mm in diameter, and then rolled into 0.20 mm in thickness.

The tape-like 19-filamentary wire is heat treated in an inert atmosphere at about 825°C. twice for about 5 h and 50 h respectively with intermediate rolling of 10% reduction, and then slowly cooled to room temperature.

As the cost of nickel is significantly lower than that of silver, the overall material cost will be cut by about 30–40%.

Other embodiments of the invention will be apparent to those skilled in the art from a consideration of this specification or practice of the invention disclosed herein. It is intended that the specification and examples shall be interpreted as illustrative and not in a limiting sense, with the true scope and spirit of the invention being indicated by the following claims

What is claimed is:

1. A method of preparing a (Bi,Pb)SrCaCuO-2223 superconducting wire, comprising the steps of:
    (a) preparing a starting precursor powder with the oxygen content adjusted to the value of the final 2223 phase;
    (b) filling the starting powder into a metal sheath;
    (c) performing deformation processing on the metal sheath to form a composite wire and develop texture in the 2212 superconducting phases;
    (d) sealing the metal sheath so that a fixed oxygen content is maintained;
    (e) performing sintering to obtain the (Bi,Pb)SrCaCuO-2223 phase in which the sintering atmosphere is chosen suitable for the outside sheath metal;
    whereby an oxidizing metal can be used to replace a silver-based material as the sheath material to reduce the material cost and to improve the mechanical and thermal properties of the superconducting composite wire.

2. The method of preparing a (Bi,Pb)SrCaCuO-2223 superconducting wire in accordance with claim 1, wherein said step of adjusting the oxygen content of said precursor powder is chosen from the group of methods consisting of quenching of the 2212 phases, and using PbO instead of $(Ca,Sr)_2PbO_4$.

3. The method of preparing a (Bi,Pb)SrCaCuO-2223 superconducting wire in accordance with claim 1, wherein the outer sheath is replaced by an oxidizing metal chosen from the group consisting of carbon steels, stainless steels, superalloys, nickel and nickel alloys, copper and copper alloys, titanium and titanium alloys.

4. The method of preparing a (Bi,Pb)SrCaCuO-2223 superconducting wire in accordance with claim 3, further comprising adding a diffusion barrier between the oxidizing metal and the silver-based metal.

5. The method of preparing a (Bi,Pb)SrCaCuO-2223 superconducting wire in accordance with claim 1, further comprising using an oxidizing metal in the inner sheath and providing a buffer layer between the inner sheath and the superconducting oxide.

6. The method of preparing a (Bi,Pb)SrCaCuO-2223 superconducting wire in accordance with claim 5, wherein said buffer layer is a silver-based material.

7. The method of preparing a (Bi,Pb)SrCaCuO-2223 superconducting wire in accordance with claim 5, wherein said buffer layer is an oxide.

8. The method of preparing a (Bi,Pb)SrCaCuO-2223 superconducting wire in accordance with claim 7, wherein said oxide is chosen from the group consisting of MgO and $BaZrO_3$.

* * * * *